(12) United States Patent
Wang et al.

(10) Patent No.: US 11,837,665 B2
(45) Date of Patent: Dec. 5, 2023

(54) THIN FILM TRANSISTOR AND MANUFACTURING METHOD THEREOF AND ELECTRONIC DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Jun Wang, Beijing (CN); Zhonghao Huang, Beijing (CN); Yongliang Zhao, Beijing (CN); Seung Moo Rim, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/806,578

(22) Filed: Jun. 13, 2022

(65) Prior Publication Data

US 2022/0310850 A1    Sep. 29, 2022

Related U.S. Application Data

(63) Continuation of application No. 16/330,255, filed as application No. PCT/CN2018/094117 on Jul. 2, 2018, now Pat. No. 11,387,371.

(30) Foreign Application Priority Data

Sep. 15, 2017    (CN) .......................... 201710835326.X (51) Int. Cl.
*H01L 29/786*    (2006.01)
*H01L 27/12*    (2006.01)
(Continued)

(52) U.S. Cl.
CPC ...... *H01L 29/78678* (2013.01); *H01L 27/127* (2013.01); *H01L 27/1222* (2013.01);
(Continued)

(58) Field of Classification Search
CPC .......... H01L 29/78678; H01L 27/1222; H01L 27/127; H01L 29/4908; H01L 29/66765;
(Continued)

(56) References Cited

U.S. PATENT DOCUMENTS 8,217,456 B1    7/2012    Anderson et al.
8,896,046 B2 *  11/2014   Kato ................... H01L 27/1225
                                        257/E21.645
(Continued)

FOREIGN PATENT DOCUMENTS

KR    20170074619 A    6/2017

OTHER PUBLICATIONS

Ali A Orouji; "Leakage Current Reduction Techniques in Poly-Si TFTs for Active Matrix Liquid Crystal Display: A Comprehensive Study", IEEE Transactions on Device and Materials Reliability, vol. 6, No. 2, Jun. 2006; 11 pages.
(Continued)

*Primary Examiner* — Edward Chin (57) ABSTRACT

A thin film transistor includes a substrate, and a gate electrode, a gate insulating layer, an active layer, a source electrode and a drain electrode which are on the substrate. The active layer includes a channel region between the source electrode and the drain electrode and the channel region includes an edge region along a channel length direction and a main region outside the edge region. The thin
(Continued)

film transistor further includes an auxiliary layer, a projection of the auxiliary layer on the substrate is at least partially overlapped with a projection of the edge region of the channel region on the substrate, and the auxiliary layer is configured to enhance a turn-on voltage of the edge region of the channel region.

18 Claims, 6 Drawing Sheets

(51) Int. Cl.
    *H01L 29/49*      (2006.01)
    *H01L 29/66*      (2006.01)
    *G02F 1/1368*      (2006.01)
    *H10K 59/121*      (2023.01)

(52) U.S. Cl.
    CPC .... *H01L 29/4908* (2013.01); *H01L 29/66765* (2013.01); *H01L 29/78696* (2013.01); *G02F 1/1368* (2013.01); *H10K 59/1213* (2023.02)

(58) Field of Classification Search
    CPC ......... H01L 29/78696; H01L 29/42384; H01L 29/41; H01L 29/66742; H01L 29/786; H01L 27/3262; G02F 1/1368; H10K 59/1213; H01J 2201/30426; H01J 2329/0426
    See application file for complete search history.

(56) References Cited

U.S. PATENT DOCUMENTS

| | | | |
|---|---|---|---|
| 2006/0043377 A1* | 3/2006 | Hoffman | H01L 29/7869 257/72 |
| 2008/0012023 A1 | 1/2008 | Matsumura et al. | |
| 2010/0090205 A1* | 4/2010 | Ofuji | H10K 59/123 257/E29.101 |
| 2010/0221905 A1* | 9/2010 | Hautala | H01L 29/7881 257/E21.21 |
| 2015/0001539 A1* | 1/2015 | Smith | H10K 77/111 257/57 |
| 2016/0035987 A1* | 2/2016 | Newsome | H10K 71/12 252/500 |
| 2016/0372469 A1* | 12/2016 | Keshavarzi | H01L 29/495 |
| 2017/0074619 A1* | 3/2017 | Dominguez | F42B 35/00 |
| 2018/0033804 A1* | 2/2018 | Bae | H01L 29/66969 |
| 2018/0294362 A1* | 10/2018 | Fukui | H01L 29/78 |
| 2019/0074377 A1* | 3/2019 | Park | H01L 29/24 |
| 2019/0305081 A1* | 10/2019 | LaJoie | H01L 27/124 |

OTHER PUBLICATIONS

Extended European Search Report dated Jul. 30, 2021; Appln. No. 18849422.3.
USPTO NFOA dated Nov. 17, 2021 in connection with U.S. Appl. No. 16/330,255.
USPTO NOA dated Mar. 10, 2022 in connection with U.S. Appl. No. 16/330,255.

* cited by examiner

THIN FILM TRANSISTOR AND MANUFACTURING METHOD THEREOF AND ELECTRONIC DEVICE

CROSS REFERENCE TO RELATED APPLICATIONS

This application is a continuation of U.S. application Ser. No. 16/330,255, filed on Mar. 4, 2019, which is a national stage application of International Application No. PCT/CN2018/094117, filed on Jul. 2, 2018, which claims priority of China Patent application No. 201710835326.X filed on Sep. 15, 2017, the content of which is incorporated in its entirety as portion of the present application by reference herein.

TECHNICAL FIELD

Embodiments of the present disclosure relate to a thin film transistor and a manufacturing method thereof and an electronic device.

BACKGROUND

A thin film transistor is an important element for some electronic devices. For example, the thin film transistor is an important switch element in a pixel circuit of an active matrix display device. A performance of the thin film transistor is an important factor influencing a performance of the electronic device.

SUMMARY

Embodiments of the present disclosure provide a thin film transistor, comprising: a substrate, and a gate electrode, a gate insulating layer, an active layer, a source electrode and a drain electrode which are on the substrate. The active layer comprises a channel region between the source electrode and the drain electrode and the channel region comprises an edge region along a channel length direction and a main region outside the edge region. The thin film transistor further comprises an auxiliary layer, a projection of the auxiliary layer on the substrate is at least partially overlapped with a projection of the edge region of the channel region on the substrate, and the auxiliary layer is configured to enhance a turn-on voltage of the edge region of the channel region.

Embodiments of the present disclosure further provide an electronic device comprising the above thin film transistor.

Embodiments of the present disclosure further provide a manufacturing method of a thin film transistor, comprising: forming a gate electrode, an auxiliary layer, a gate insulating layer, an active layer, a source electrode and a drain electrode on a substrate. The active layer comprises a channel region between the source electrode and the drain electrode and the channel region comprises an edge region along a channel length direction and a main region outside the edge region. A projection of the auxiliary layer on the substrate is at least partially overlapped with a projection of the edge region of the channel region on the substrate, and the auxiliary layer is configured to enhance a turn-on voltage of the edge region of the channel region.

BRIEF DESCRIPTION OF THE DRAWINGS

In order to clearly illustrate the technical solution of the embodiments of the invention, the drawings of the embodi-ments will be briefly described in the following; it is obvious that the described drawings are only related to some embodiments of the invention and thus are not limitative of the invention.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1A:
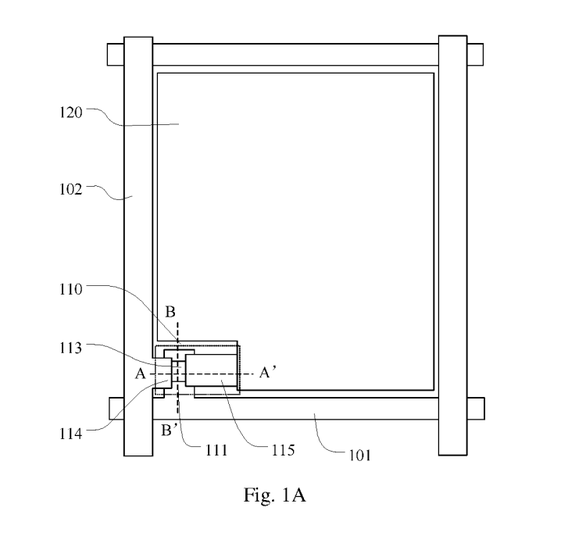
FIG. 1A is a structural schematic view of a sub-pixel unit in an array substrate of a liquid crystal display device.

A thin film transistor is an important element in an electronic device. FIG. 1A is a structural schematic view of a sub-pixel unit in an array substrate of a liquid crystal display device. The array substrate which is exemplarily applied in a liquid crystal display device usually comprises a plurality of gate lines 101 and a plurality of data lines 102, these gate lines 101 and data lines 102 intersect with each other and thereby define a plurality of sub-pixel units disposed in an array (FIG. 1A illustrates only one sub-pixel unit in detail), and each sub-pixel unit comprises a thin film transistor 110 and a pixel electrode 120 which is configured to control an arrangement of liquid crystal. The thin film transistor 110 functions as a switch element which controls a signal transmission between the data line 102 and the pixel electrode 120.

Figure 1B:
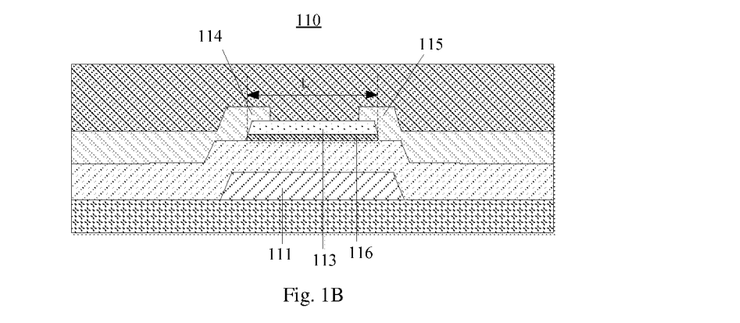
FIG. 1B is a schematic sectional view of the thin film transistor of FIG. 1A along a section line A-A'.

FIG. 1B is a schematic sectional view of the thin film transistor of FIG. 1A along a section line A-A'. Referring to FIG. 1A in combination with FIG. 1B, the thin film transistor 110 is in a bottom-gate structure, comprising a gate electrode 111, a gate insulating layer 112, an active layer 113, a source electrode 114 and a drain electrode 115 which are sequentially stacked on a substrate. The active layer 113 comprises a channel region 116 close to an interface between the active layer 113 and the gate insulating layer 112, and the channel region 116 is between the source electrode 114 and the drain electrode 115. Taking the thin film transistor 110 as a thin film transistor in an enhancement mode for example, in a case where the gate electrode 111 is applied with a biased voltage higher than a threshold voltage Vth, inversion charges of a same concentration as a doping concentration of the active layer are generated in the channel region 116. The inversion charges move directionally under an action of an electrical field between the source electrode 114 and the drain electrode 115 and thereby a turn-on current is generated. "Turn-on voltage" in the present disclosure also means a threshold voltage. A direction along a current direction of the channel region 116 is a channel length direction, accordingly a length of the channel region along the channel length direction is a channel length L, and a direction perpendicular to the channel length direction is a channel width direction. "An edge region along a channel length direction" of the present disclosure means a region where a side edge, which extends along the channel length direction, of the channel region of the active layer is located. For example, an extension direction of the edge region is parallel to an extension direction of a centerline of the channel region in the channel width direction. For example, an extension direction of the edge region is parallel to a direction of the channel length. For example, a width of the edge region may be less than or equal to ¼ of a width of the channel region, or may be less than or equal to ⅙ of the width of the channel region.

Figure 1C:
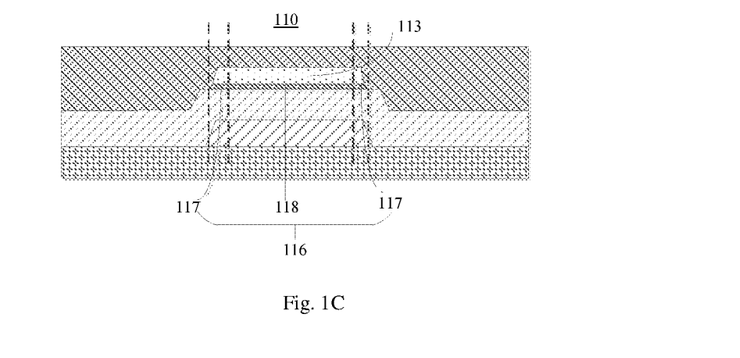
FIG. 1C is schematic sectional view of the thin film transistor of FIG. 1A along a section line B-B'.

The inventor finds a voltage easily gathers at the edge region of an active layer of a thin film transistor, so as to cause the edge region to turn on earlier than a non-edge region, and a hump effect is caused. Referring to FIG. 1C, FIG. 1C is schematic sectional view of the thin film transistor of FIG. 1A along a section line B-B'. Because a gate voltage easily gathers at an edge region 117 of the channel region 116, inversion charges are earlier generated in the edge region 117 than in a non-edge main region 118 of the channel region 116. As a result, before the gate voltage reaches a threshold voltage of the thin film transistor 110 and the main region 118 of the channel region 116 is turned on, a turn-on current is generated in advance in the edge region 117 and a hump effect is caused. The hump effect can badly influence a sub-threshold performance of the thin film transistor 110 and causes an instability in the performance of the thin film transistor.

Embodiments of the present disclosure provide a thin film transistor, a manufacturing method thereof and an electronic device. The thin film transistor comprises a substrate, and a gate electrode, a gate insulating layer, an active layer, a source electrode and a drain electrode which are on the substrate. The active layer comprises a channel region between the source electrode and the drain electrode and the channel region comprises an edge region along a channel length direction and a main region outside the edge region.

The thin film transistor further comprises an auxiliary layer, a projection of the auxiliary layer on the substrate is at least partially overlapped with a projection of the edge region of the channel region on the substrate, and the auxiliary layer is configured to enhance a turn-on voltage of the edge region of the channel region.

The thin film transistor according to embodiments of the present disclosure enhances the turn-on voltage of the edge region of the channel region by providing the auxiliary layer corresponding to the edge region of the channel region, so as to allow a turn-on current to be almost synchronously generated in the edge region as well as in the main region of the channel region. In this way, the hump effect of the thin film transistor is alleviated or eliminated.

For example, the turn-on voltage of the edge region of the channel region may be enhanced by adjusting a relationship between a work function of a material of the gate electrode and a work function of a material of the active layer corresponding to the channel edge region. A work function of a material means a minimum energy which is required for an electron to escape from a surface of the material. In a Metal-Insulator-Semiconductor (MIS) structure comprised of a gate electrode, a gate insulating layer and an active layer of a thin film transistor, a work function difference $\phi$ ms between the gate electrode material and the active layer material is an important factor influencing a threshold voltage of the thin film transistor. For example, in a condition that an influence of net charges in the gate insulating layer is not considered, the greater a work function difference between the gate electrode material and the active layer material is, the higher the threshold voltage of the thin film transistor is. Descriptions are given below taking the thin film transistor as an enhancement-mode thin film transistor (Vth is greater than 0) and the work function difference $\phi$ ms between the gate electrode material and the active layer material as positive for example. However, embodiments of the present disclosure also apply for a depletion-mode transistor (Vth is less than 0) and a transistor wherein the work function difference $\phi$ ms between the gate electrode material and the active layer material is less than or equal to 0; that is, the specific type of the transistor is not limited to the present disclosure.

For example, the auxiliary layer may be disposed between the gate electrode and the active layer.

For example, a material of the auxiliary layer is a conductive layer, and the auxiliary layer is electrically connected with the gate electrode and thereby forms an auxiliary gate electrode.

For example, the auxiliary layer may be disposed between the gate electrode and the gate insulating layer, or disposed in a same layer as the gate electrode. "disposed in a same layer" mentioned here means the auxiliary layer and the gate electrode are formed on a same surface of a same layer structure (e. g. the gate insulating layer) and may be made of different materials.

For example, a work function of a material of the auxiliary layer is provided to be higher than a work function of a material of the gate electrode. Therefore, a work function difference between the auxiliary layer material and the active layer material is greater than a work function difference $\phi$ ms between the gate electrode material and the active layer material, so that a turn-on voltage of the edge region of the channel region is enhanced.

For example, the material of the gate electrode may be one or any combination of the following metal materials: copper, molybdenum, titanium, tungsten and aluminum; the material of the auxiliary layer may be one or any combination of the following metal materials: platinum, gold and palladium.

For example, the material of the gate electrode and the material of the auxiliary layer both are a conductive material with an adjustable work function, for example, conductive silicon or a conductive metal oxide. For example, the auxiliary layer may be disposed between the active layer and the gate insulating layer to form an auxiliary active layer. The material of the auxiliary layer is a semiconductor material, and the work function of the material of the auxiliary layer is lower than the work function of the material of the active layer. Therefore, a work function difference between the gate electrode material and the auxiliary layer material is greater than a work function difference $\phi$ ms between the gate electrode material and the active layer material, so that a turn-on voltage of the edge region of the channel region is enhanced.

For example, the material of the active layer may be amorphous silicon, polysilicon, metal oxide semiconductor and the like, the polysilicon may be high-temperature polysilicon or low-temperature polysilicon, and the metal oxide semiconductor may be zinc oxide, indium tin oxide (ITO), indium gallium zinc oxide (IGZO) and the like. An ion doping may be further performed to the active layer according to needs.

For example, the auxiliary layer comprises two auxiliary structures which are spaced apart from each other, and the two auxiliary structures are disposed respectively corresponding to two edge regions of the channel region. The two auxiliary structures are spaced by a gap with a predetermined distance and a portion of the gap corresponds to the main region of the active layer.

For example, the thin film transistor may be of a bottom-gate type, a top-gate type, a hybrid type of bottom-gate type and top-gate type or the like. In a direction perpendicular to the substrate, projections of the gate electrode, the auxiliary layer and the active layer on the substrate are at least partially overlapped.

For example, in a condition that the thin film transistor is in a bottom-gate structure and the auxiliary layer is disposed in a same layer as the gate electrode, a thickness of the auxiliary layer may be less than one tenth of a thickness of the gate electrode.

Specific embodiments of the present disclosure are illustrated in connection with figures so as to make the present disclosure better understood.

First Embodiment

Figure 2A:
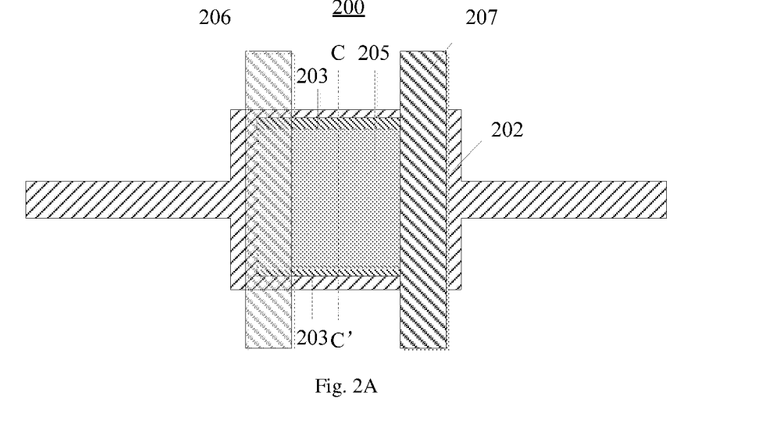
FIG. 2A is a schematic top view of a thin film transistor provided by a first embodiment of the present disclosure.
Figure 2B:
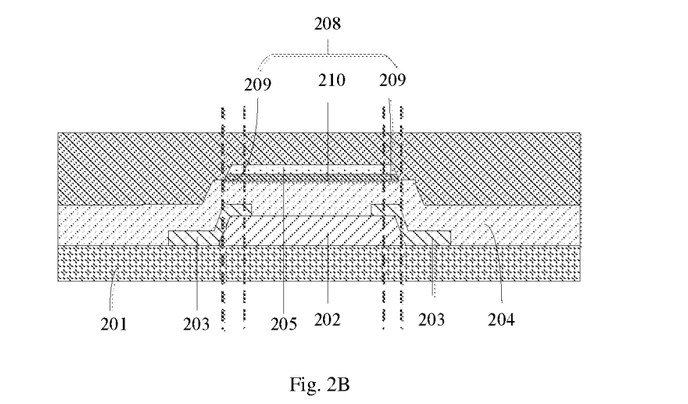
FIG. 2B is an example of a schematic sectional view of the thin film transistor of FIG. 2A along a section line C-C'.
Figure 2C:
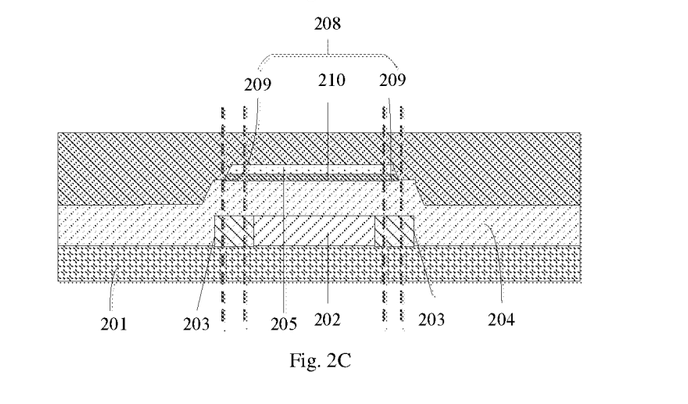
FIG. 2C is another example of a schematic sectional view of the thin film transistor of FIG. 2A along the section line C-C'.

FIG. 2A is a schematic top view of a thin film transistor 200 provided by a first embodiment of the present disclosure, FIG. 2B is an example of a schematic sectional view of the thin film transistor of FIG. 2A along a section line C-C', and FIG. 2C is another example of a schematic sectional view of the thin film transistor of FIG. 2A along the section line C-C'.

Referring to FIG. 2A in combination with FIG. 2B, the bottom-gate thin film transistor 200 comprises a gate electrode 202, an auxiliary layer 203, a gate insulating layer 204, an active layer 205, a source electrode 206 and a drain electrode 207 which are sequentially stacked on a substrate 201. The active layer 205 comprises a channel region 208 between the source electrode 206 and the drain electrode 207 and the channel region 208 comprises an edge region 209 along a channel length direction and a main region 210 except the edge region 209. A projection of the auxiliary layer 203 on the substrate 201 is at least partially overlapped with a projection of the edge region 209 of the channel region 208 on the substrate 201, and the auxiliary layer 203 is configured to enhance a turn-on voltage of the edge region 209 of the channel region 208.

For example, the auxiliary layer may be disposed between the gate electrode and the active layer.

For example, the auxiliary layer 203 is disposed corresponding to the edge region 209 of the channel region 208, and projections of the gate electrode 202, the auxiliary layer 203 and the active layer 205 on the substrate 201 are at least partially overlapped.

For example, as illustrated in FIG. 2B, the auxiliary layer 203 is disposed between the gate electrode 202 and the gate insulating layer 204.

For example, a thickness of the auxiliary layer is less than one tenth of a thickness of the gate electrode. For example, the thickness of the auxiliary layer is 15-30 nm, so as to prevent a step of the auxiliary layer in the bottom-gate structure from influencing a film formation quality of the active layer.

As shown in the figure, the auxiliary layer 203 comprises two auxiliary gate electrodes which are spaced apart from each other, and the two auxiliary gate electrodes are disposed to respectively correspond to the two edge regions 209 of the channel region 208. In another example, the auxiliary layer comprises only one auxiliary gate electrode which corresponds to only one edge region.

Here, the work function of the material of the gate electrode 202 is lower than the work function of the material of the auxiliary layer 203. In this embodiment, the material of the gate electrode 202 is molybdenum (Mo), of which the work function is 4.37 eV; the material of the auxiliary layer 203 is platinum (Pt), of which the work function is 5.65 eV. In this way, the difference between the work function of the material of the auxiliary layer 203 and the work function of the material of the active layer 205 is greater than a difference between the work function of the material of the gate electrode 202 and the work function of the material of the active layer 205, so as to ultimately allow a turn-on voltage of the edge region 209 of the channel region 208 to be greater than a turn-on voltage of the main region 210 of the channel region 208.

In other examples, other combinations may be selected, in which the work function of the auxiliary layer material is higher than the work function of the gate electrode material, so as to allow the difference between the work function of the auxiliary layer material and the work function of the active layer material to be greater than the difference between the work function of the gate electrode material and the work function of the active layer material. For example, the material of the gate electrode is one or any combination of the following metal materials: copper (4.65 eV), molybdenum (4.37 eV), titanium (4.33 eV), tungsten (4.55 eV), and aluminum (4.28 eV); and the material of the auxiliary layer is one or any combination of the following metal materials: platinum (5.65 eV), gold (5.1 eV) and palladium (5.12 eV).

Or, the material of the gate electrode and the material of the auxiliary layer both may be a conductive material with an adjustable work function, for example, conductive silicon or a conductive metal oxide.

For example, the material of the gate electrode and the material of the auxiliary layer are both polysilicon, and a doping concentration of the polysilicon may be adjusted to allow the work function of the auxiliary gate electrode material to be higher than the work function of the gate electrode material. Similarly, for example, the material of the gate electrode and the material of the auxiliary gate electrode are both indium tin oxide (ITO), and a composition of the ITO may be adjusted to allow the work function of the auxiliary gate electrode material to be higher than the work function of the gate electrode material.

FIG. 2C is another example of a schematic sectional view of the thin film transistor 200 of FIG. 2A along the section line C-C'. Unlike the thin film transistor of the embodiment illustrated in FIG. 2B, in the embodiment, the auxiliary layer 203 and the gate electrode 202 are disposed in a same layer, that is, the auxiliary layer 203 and the gate electrode 202 are disposed on a same surface of the substrate 201. As illustrated in the figure, the auxiliary layer 203 is disposed to correspond to the edge region 209 of the channel region 208 and the gate electrode 202 is disposed to correspond to the main region 210 of the channel region 208. For example, the auxiliary layer 203 may have a same thickness as the gate electrode 202.

Second Embodiment

Figure 3:
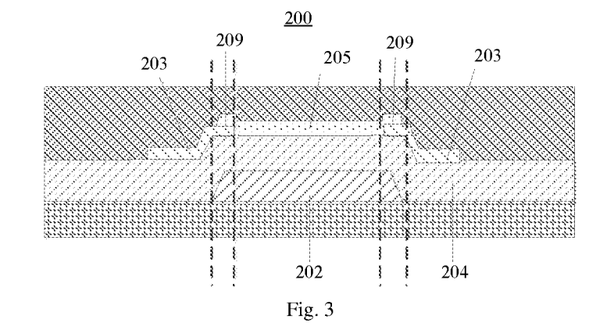
FIG. 3 is a schematic sectional view of a thin film transistor provided by a second embodiment of the present disclosure.

FIG. 3 is a schematic sectional view of a thin film transistor 200 provided by a second embodiment of the present disclosure. Referring to FIG. 3, the structure of the thin film transistor of the second embodiment is substantially same as the structure of the thin film transistor of the first embodiment, and the only differences are the location and the material of the auxiliary layer 203. As illustrated in figure, the auxiliary layer 203 is disposed between the active layer 205 and the gate insulating layer 204. In this embodiment, the auxiliary layer 203 is an auxiliary active layer and the material of the auxiliary layer 203 is a semiconductor material.

As illustrated in the figure, the auxiliary layer 203 is two auxiliary active layers which are spaced from each other, and the two auxiliary active layers are disposed to respectively correspond to two edge regions 209 of the channel region 208. In another example, the auxiliary layer comprises only one auxiliary active layer which corresponds to only one edge region of the channel region.

Here, the work function of the material of the active layer 205 is higher than the work function of the material of the auxiliary layer 203. In this embodiment, the material of the active layer and the auxiliary layer are both polysilicon. Polysilicons with different doping concentrations may be selected to allow the work function of the polysilicon material for the auxiliary layer 203 to be lower than work function of the polysilicon material for the active layer 205. In this way, the difference between the work function of the material of the gate electrode 202 and the work function of the material of the auxiliary layer 203 is greater than the difference between the work function of the material of the gate electrode 202 and the work function of the material of the active layer 205, so as to ultimately allow a turn-on voltage of the edge region 209 of the channel region 208 to be greater than a turn-on voltage of the main region 210 of the channel region.

In other embodiments, other combinations may be selected, in which the work function of the active layer material is higher than the work function of the auxiliary layer material, so as to allow the difference between the work function of the gate electrode material and the work function of the auxiliary layer material to be greater than the difference between the work function of the gate electrode material and the work function of the active layer material.

Third Embodiment

Figure 4A:
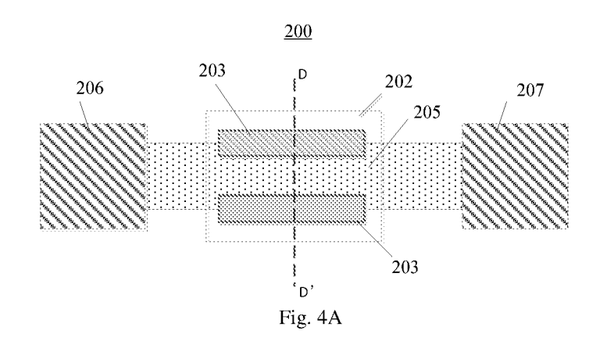
FIG. 4A is a schematic top view of a thin film transistor provided by a third embodiment of the present disclosure.
Figure 4B:
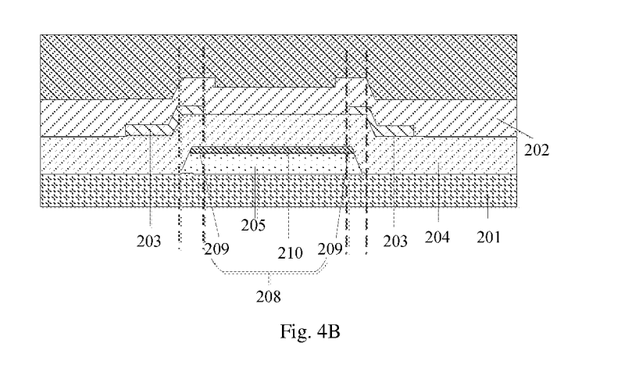
FIG. 4B is an example of a schematic sectional view of the thin film transistor of FIG. 4A along a section line D-D'.
Figure 4C:
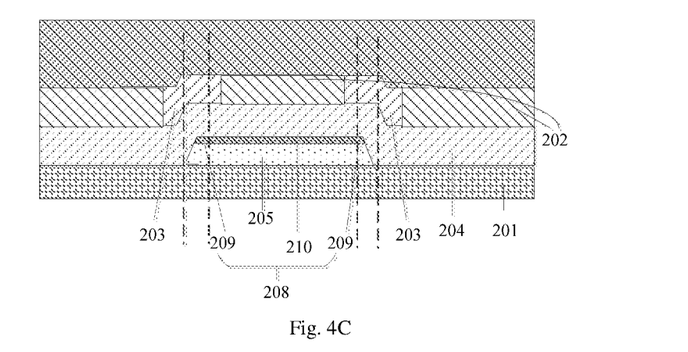
FIG. 4C is another example of a schematic sectional view of the thin film transistor of FIG. 4A along the section line D-D'.

FIG. 4A is a schematic top view of a thin film transistor 200 provided by a third embodiment of the present disclosure; FIG. 4B is an example of a schematic sectional view of the thin film transistor 200 of FIG. 4A along a section line D-D'; and FIG. 4C is another example of a schematic sectional view of the thin film transistor 200 of FIG. 4A along the section line D-D'. For convenience, same elements are indicated with same reference numbers, which is not repeated below.

Referring to FIG. 4A in combination with FIG. 4B, the top-gate thin film transistor 200 comprises a source electrode 206 and a drain electrode 207, an active layer 205, a gate insulating layer 204, an auxiliary layer 203 and a gate electrode 202 which are sequentially stacked on a substrate 201. The active layer 205 comprises a channel region 208 close to the gate insulating layer 204 and the channel region 208 comprises an edge region 209 along a channel length direction and a main region 210 other than the edge region 209. A projection of the auxiliary layer 203 on the substrate 201 is at least partially overlapped with a projection of the edge region 209 of the channel region 208 on the substrate 201, and the auxiliary layer 203 is configured to enhance a turn-on voltage of the edge region 209 of the channel region 208.

For example, the auxiliary layer may be disposed between the gate electrode and the active layer.

For example, the auxiliary layer 203 is disposed corresponding to the edge region 209 of the channel region 208, and projections of the gate electrode 202, the auxiliary layer 203 and the active layer 205 on the substrate 201 are at least partially overlapped.

For example, as illustrated in FIG. 4B, the auxiliary layer 203 is disposed between the gate electrode 202 and the gate insulating layer 204.

As illustrated in the figure, the auxiliary layer 203 comprises two auxiliary gate electrodes which are spaced apart from each other, and the two auxiliary gate electrodes are disposed to respectively correspond to the two edge regions 209 of the channel region 208. In another example, the auxiliary layer comprises only one auxiliary gate electrode which corresponds to only one edge region of the channel region.

A work function of a material of the gate electrode 202 is lower than a work function of a material of the auxiliary layer 203. In this embodiment, the material of the gate electrode 202 is molybdenum (Mo), of which the work function is 4.37 eV; the material of the auxiliary layer 203 is platinum (Pt), of which the work function is 5.65 eV. In this way, the difference between the work function of the material of the auxiliary layer 203 and the work function of the material of the active layer 206 is greater than a difference between the work function of the material of the gate electrode 202 and the work function of the material of the active layer 205, so as to ultimately allow a turn-on voltage of the edge region 209 of the channel region 208 to be greater than a turn-on voltage of the main region 210 of the channel region.

In other examples, other combinations may be selected, in which the work function of the auxiliary layer material is higher than the work function of the gate electrode material, so as to allow the difference between the work function of the auxiliary layer material and the work function of the active layer material to be greater than the difference between the work function of the gate electrode material and the work function of the active layer material. For example, the material of the gate electrode is one or any combination of the following metal materials: copper (4.65 eV), molybdenum (4.37 eV), titanium (4.33 eV), tungsten (4.55 eV), and aluminum (4.28 eV); and the material of the auxiliary layer is one or any combination of the following metal materials: platinum (5.65 eV), gold (5.1 eV) and palladium (5.12 eV).

For example, the material of the gate electrode and the material of the auxiliary layer both may be a conductive material with an adjustable work function, for example, conductive silicon or a conductive metal oxide.

For example, the material of the gate electrode and the material of the auxiliary layer both are polysilicon, and a doping concentration of the polysilicon may be adjusted to allow the work function of the auxiliary gate electrode material to be higher than the work function of the gate electrode material. Similarly, for example, the material of the gate electrode and the material of the auxiliary gate electrode are both indium tin oxide (ITO), and a composition of the ITO may be adjusted to allow the work function of the auxiliary gate electrode material to be higher than the work function of the gate electrode material.

FIG. 4C is another example of a schematic sectional view of the thin film transistor 200 of FIG. 4A along the section line C-C'. Unlike the thin film transistor of the embodiment illustrated in FIG. 4B, in this embodiment, the auxiliary layer 203 and the gate electrode 202 are disposed in a same layer, that is, the auxiliary layer 203 and the gate electrode 202 are disposed on a same surface of the gate insulating layer 204. As illustrated in the figure, the auxiliary layer 203 is disposed to correspond to the edge region 209 of the channel region 208 and the gate electrode 202 is disposed to correspond to the main region 210 of the channel region 208. For example, the auxiliary layer 203 may have a same thickness as the gate electrode 202.

Fourth Embodiment

Figure 5:
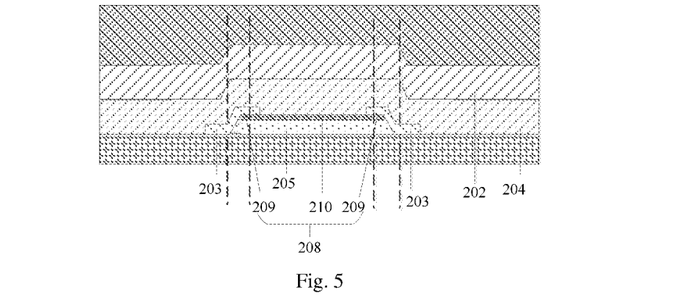
FIG. 5 is a schematic sectional view of a thin film transistor provided by a fourth embodiment of the present disclosure.

FIG. 5 is a schematic sectional view of a thin film transistor 200 provided by a fourth embodiment of the present disclosure. The structure of the thin film transistor of the fourth embodiment is almost same as the structure of the thin film transistor of the third embodiment, and the only differences are the location and the material of the auxiliary layer 203. Referring to FIG. 5, the auxiliary layer 203 is disposed between the active layer 205 and the gate insulating layer 204. In this embodiment, the auxiliary layer 203 is an auxiliary active layer and a material of the auxiliary layer 203 is a semiconductor material.

As illustrated in the figure, the auxiliary layer comprises two auxiliary active layers which are spaced from each other, and the two auxiliary active layers are disposed respectively on two edge regions 209 of the channel region 208. In another example, the auxiliary comprises only one auxiliary active layer which corresponds to only one edge region of the channel region.

For example, the work function of the material of the active layer 205 is higher than the work function of the material of the auxiliary layer 203. In this embodiment, the material of the active layer and the auxiliary layer are both polysilicon. Polysilicons with different doping concentrations may be selected to allow the work function of the polysilicon material for the auxiliary layer 203 to be lower than work function of the polysilicon material for the active layer 205. In this way, the difference between the work function of the material of the gate electrode 202 and the work function of the material of the auxiliary layer 203 is greater than the difference between the work function of the material of the gate electrode 202 and the work function of the material of the active layer 205, so as to ultimately allow a turn-on voltage of the edge region 209 of the channel region 208 to be greater than a turn-on voltage of the main region 210 of the channel region.

In other embodiments, other combinations may be selected, in which the work function of the active layer material is higher than the work function of the auxiliary layer material, so as to allow the difference between the work function of the gate electrode material and the work function of the auxiliary layer material to be greater than the difference between the work function of the gate electrode material and the work function of the active layer material.

The thin film transistor according to this embodiment enhances the turn-on voltage of the edge region of the channel region by providing the auxiliary layer between the gate electrode and the active layer corresponding to the edge region along the channel length direction of the channel region, so as to allow a turn-on current to be almost synchronously generated in the edge region as well as in the main region of the channel region. In this way, the hump effect of the thin film transistor is alleviated or eliminated and the performance of the thin film transistor is improved.

Fifth Embodiment

Additionally, embodiments of the present disclosure further provide a manufacturing method of a thin film transistor which may be used for manufacturing the thin film transistors of the above mentioned embodiments. The method at least comprises: forming a gate electrode, an auxiliary layer, a gate insulating layer, an active layer, a source electrode and a drain electrode on a substrate; forming the auxiliary layer between a step of forming the gate electrode and a step of forming the active layer. The active layer comprises a channel region between the source electrode and the drain electrode and the channel region comprises an edge region along a channel length direction and a main region outside the edge region. A projection of the auxiliary layer on the substrate is at least partially overlapped with a projection of the edge region of the channel region on the substrate, and the auxiliary layer is configured to enhance a turn-on voltage of the edge region of the channel region.

For example, the gate electrode and the auxiliary layer may be respectively formed through an exposure process, or formed through one exposure process with a gray tone mask. Or, for example, the active layer and the auxiliary layer may be respectively formed through an exposure process, or formed through one exposure process with a gray tone mask.

For example, the auxiliary layer is formed between the gate electrode and the active layer.

The manufacturing method of a thin film transistor provided by a fifth embodiment and a modified embodiment thereof of the present disclosure is described in combination with FIGS. 6A-6C and FIG. 7.

Figure 6A:
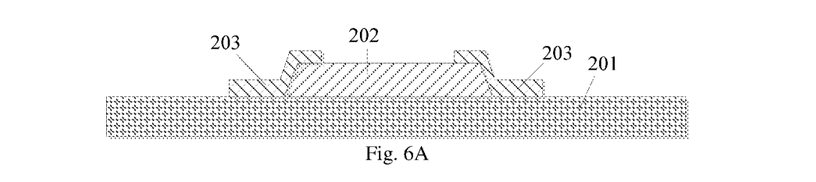
FIGS. 6A-6D and FIG. 7 are schematic sectional views of steps of a method for manufacturing a thin film transistor provided by a fifth embodiment and a modified embodiment thereof of the present disclosure.

Step S61, forming a gate electrode 202.

As illustrated in FIG. 6A, a first conductive layer is formed on a substrate 201 and a gate electrode 202 is formed by patterning the first conductive layer using a first patterning process. Here, the substrate 201 is provided and then the substrate is cleaned and dried. The substrate 201 may be a bendable flexible substrate, for example, a substrate made of various kinds of plastic films such as polyethylene terephthalate (PET), polyether sulfone (PES), polycarbonate (PC) polyimide (PI) or derivative of the above. Or, the substrate 201 may be a rigid substrate, such as a glass substrate, a stainless steel substrate and the like.

Step S62, forming an auxiliary layer 203, and the auxiliary gate electrode 203 and the gate electrode 202 are formed to be electrically connected with each other.

Keeping referring to FIG. 6A, a second conductive layer is formed on the gate electrode 202 and is patterned to form an auxiliary layer 203. The auxiliary layer 203 is formed on an edge region of the gate electrode 202 along a channel length direction of the thin film transistor to be formed. In this embodiment, the auxiliary layer 203 is formed to be two auxiliary gate electrodes which are spaced apart from each other and respectively correspond to two edge regions 209 of a channel region 208. In another example, the auxiliary layer comprises only one auxiliary gate electrode which corresponds to only one edge region of the channel region, and a thickness of the auxiliary layer is less than one tenth of a thickness of the gate electrode. For example, the thickness of the auxiliary layer is 15-30 nm, so as to prevent a step of the auxiliary layer in the bottom-gate structure from influencing a film formation quality of an active layer.

A work function of a material of the first conductive layer is selected to be lower than a work function of a material of the second conductive layer, so as to allow a work function of a material of the gate electrode 202 to be lower than a work function of a material of the auxiliary layer 203. In this embodiment, the material of the first conductive layer is molybdenum (Mo), of which the work function is 4.37 eV; the material of the second conductive layer is platinum (Pt), of which the work function is 5.65 eV. In this way, the difference between the work function of the material of the auxiliary layer 203 and the work function of the material of the active layer is greater than a difference between the work function of the material of the gate electrode 202 and the work function of the material of the active layer.

In other examples, other combinations may be selected, in which the work function of the second conductive layer material is higher than the work function of the first conductive layer material. For example, the material of the first conductive layer is one or any combination of the following metal materials: copper (4.65 eV), molybdenum (4.37 eV), titanium (4.33 eV), tungsten (4.55 eV), and aluminum (4.28 eV); and the material of the second conductive layer is one or any combination of the following metal materials: platinum (5.65 eV), gold (5.1 eV) and palladium (5.12 eV).

For example, the material of the first conductive layer and the material of the second conductive layer both may be a conductive material with an adjustable work function, for example, conductive silicon or a conductive metal oxide.

For example, the material of the first conductive layer and the material of the second conductive layer both are polysilicon, and a doping concentration of the polysilicon may be adjusted to allow the work function of the second conductive layer material to be higher than the work function of the first conductive layer material. Similarly, for example, the material of the first conductive layer and the material of the second conductive layer are both indium tin oxide (ITO), and a composition of the ITO may be adjusted to allow the work function of the second conductive layer material to be higher than the work function of the first conductive layer material.

Figure 6B:
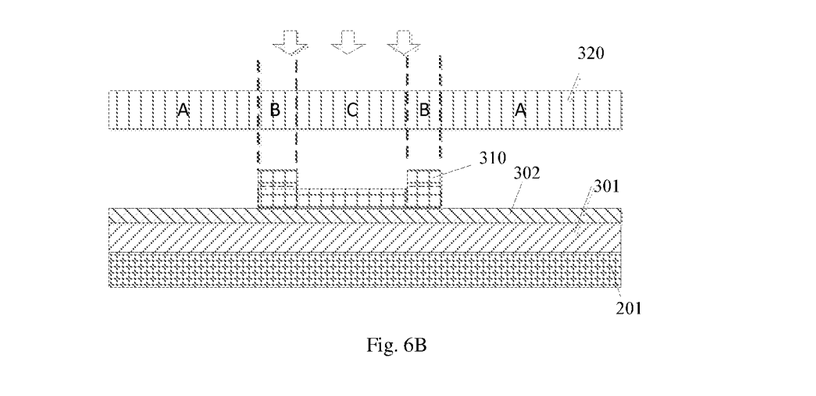
Figure 6C:
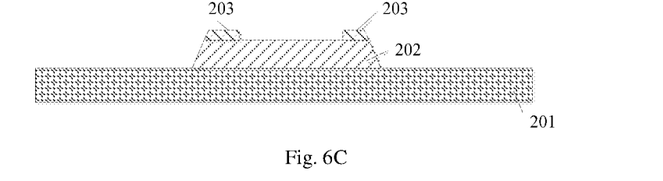

In a modified embodiment, the gate electrode 202 and the auxiliary layer 203 may be formed through one exposure process. For example, the gate electrode 202 and the auxiliary layer 203 may be formed through one exposure process with a half tone mask. Referring to FIG. 6B in combination with FIG. 6C, after the first conductive layer 301 and the second conductive layer 302 are sequentially formed on the substrate 201, a photoresist layer 310 is formed on the second conductive layer 302 and an exposure process is performed to the photoresist layer 310 with a half tone mask 320. As illustrate in FIG. 6B, the half tone mask 320 comprises three regions A, B and C which are symmetrically distributed and have different light transmittance. The region A is a completely-transparent region, the region B is a non-transparent region and the region C is a partially-transparent region. After the photoresist layer 310 is exposed and developed, a pattern as illustrated in FIG. 6B is formed. A region (not shown) of the first conductive layer 301 and the second conductive layer 302 not covered by the photoresist layer 310 is removed through a first etching step. Then the photoresist layer 310 is treated to form a pattern illustrated by dashed line in FIG. 6B, and subsequently the gate electrode 202 and the auxiliary layer 203 as illustrated in FIG. 6C are formed through a second etching step.

Figure 6D:
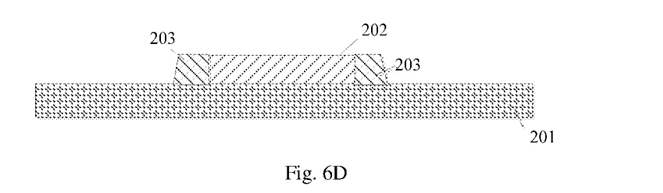

In another embodiment, as illustrated in FIG. 6D, the gate electrode 202 and the auxiliary layer 203 may be formed in a same layer; that is, the gate electrode 202 and the auxiliary layer 203 may be formed on a same surface of the substrate 201. For example, the gate electrode 202 and the auxiliary layer 203 may be respectively formed through performing a deposition process and a patterning process of a conductive material twice, which is not repeated here. For example, a thickness of the auxiliary layer 203 is same as a thickness of the gate electrode 202.

Figure 7:
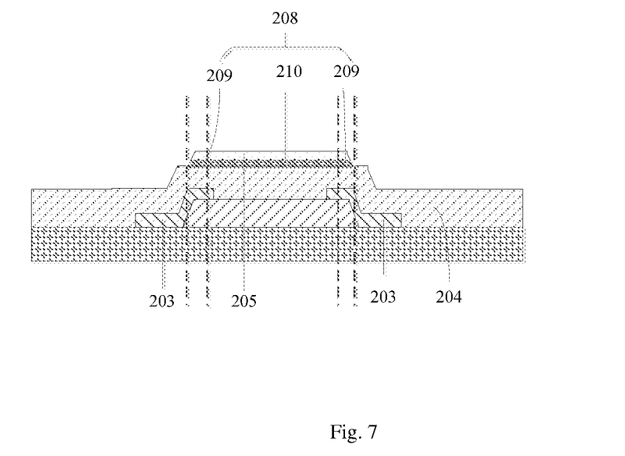

Step S63, forming a gate insulating layer and an active layer 205.

As illustrated in FIG. 7, a gate insulating layer 204 is formed on the auxiliary layer 203, and subsequently a semiconductor layer is formed on the gate insulating layer 204. Then an active layer 205 is formed by patterning the conductive layer using a third patterning process. The active layer 205 comprises a channel region 208 close to the gate insulating layer 204 and the channel region 208 comprises two edge regions 209 and a main region 210 other than the edge regions 209, and the two edge regions 209 are opposite to each other along a channel length direction. The two edge regions 209 correspond to the auxiliary layer 203; that is, the two edge regions 209 respectively correspond to two auxiliary gate electrodes, and a projection of each of the two edge regions 209 on the substrate 201 is at least partially overlapped with a projection of the corresponding auxiliary gate electrode on the substrate 201.

Here, projections of the gate electrode 202, the auxiliary layer 203 and the active layer 205 on the substrate 201 are at least partially overlapped.

Step S64, forming a source electrode and a drain electrode (not shown).

A third conductive layer is formed on the active layer 205 and a source electrode 206 and a drain electrode 207 are formed by using a fourth patterning process to pattern the third conductive layer. The third conductive layer may be selected from materials molybdenum, titanium, aluminum, copper and alloy of the above.

In this way, the thin film transistor 200 of the first embodiment of the present disclosure is formed.

In a modified embodiment, the step for forming the auxiliary layer 203 is after forming the gate insulating layer 204 and before forming the active layer 205. In this embodiment, a material of the auxiliary layer 203 is a semiconductor material and the auxiliary layer 203 functions as an auxiliary active layer. A number of the auxiliary active layer is two, and the two auxiliary active layers are disposed to respectively correspond to the two edge regions 209 of the channel region 208. Further, a work function of a material of the auxiliary layer 203 is enabled to lower than a work function of a material of the active layer 205, so that a turn-on voltage of the edge region 209 is enhanced. In this way, the thin film transistor 200 of the second embodiment of the present disclosure is formed.

For example, the materials of the active layer and the auxiliary layer are both polysilicon. Polysilicons with different doping concentrations may be selected to allow the work function of the polysilicon material for the auxiliary layer to be lower than the work function of the polysilicon material for the active layer. In this way, the difference between the work function of the gate electrode material and the work function of the auxiliary layer material is greater than the difference between the work function of the gate electrode material and the work function of the active layer material, so as to ultimately allow a turn-on voltage of the edge region 209 of the channel region 208 to be greater than a turn-on voltage of the main region 210 of the channel region.

In other examples, other combinations may be selected, in which the work function of the active layer material is higher than the work function of the auxiliary layer material, so as to allow the difference between the work function of the gate electrode material and the work function of the auxiliary layer material to be greater than the difference between the work function of the gate electrode material and the work function of the active layer material.

For example, in a case of manufacturing an array substrate for a liquid crystal display device, an organic light-emitting diode display device and the like, components such as a storage capacitor and a pixel electrode may be formed meanwhile forming the thin film transistor.

Sixth Embodiment

Figure 8:
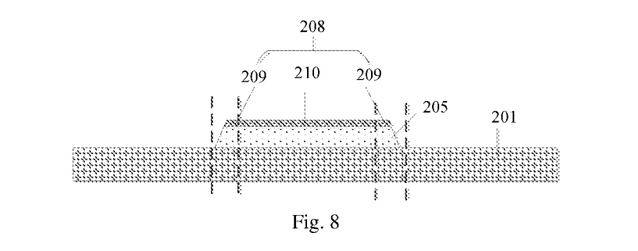
FIGS. 8-10 are schematic sectional views of steps of a method for manufacturing a thin film transistor provided by a sixth embodiment and a modified embodiment thereof of the present disclosure.
Figure 9:
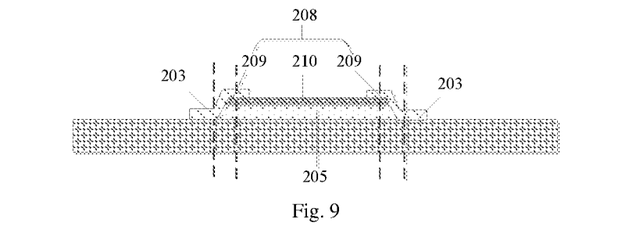

The manufacturing method of a thin film transistor provided by a sixth embodiment and a modified embodiment thereof of the present disclosure is described in combination with FIGS. 8-9.

Step S81, forming an active layer 205.

A substrate 201 is provided and then the substrate 201 is cleaned and dried. The substrate 201 may be a bendable flexible substrate, for example, a substrate made of various kinds of plastic films such as polyethylene terephthalate (PET), polyether sulfone (PES), polycarbonate (PC) polyimide (PI) or derivative of the above. Or, the substrate 201 may be a rigid substrate, such as a glass substrate, a stainless steel substrate and the like.

As illustrated in FIG. 8, a first semiconductor layer is formed on the substrate 201 and an active layer 205 is formed by using a first patterning process to pattern the first semiconductor layer. The active layer 205 comprises a channel region 208 away from the substrate 201. The channel region 208 comprises two edge regions 209 and a main region 210 except the two edge regions 209. The two edge regions 209 are opposite to each other along a channel length direction.

If needed, a buffer layer may be further formed between the substrate 201 and the active layer 205. The buffer layer can prevent impurities of the substrate from diffusing into the active layer and affecting a performance of the active layer.

Step S82, forming an auxiliary layer 203.

As illustrated in FIG. 9, a second semiconductor layer is formed on the active layer 205 and an auxiliary layer 203 is formed by performing a patterning process to the second semiconductor layer. The auxiliary layer 203 is formed on the edge region 209 of the active layer 205. A work function of a material of the first semiconductor layer is enabled to have a special relationship with a work function of a material of the second semiconductor layer so as to enhance a turn-on voltage of the edge region 209 of the channel region.

As illustrated in the figure, the auxiliary layer 203 comprises two auxiliary active layers which are spaced apart from each other and are respectively formed on the two edge regions 209 of the active layer 205. In another example, the auxiliary layer comprises only one auxiliary active layer which corresponds to only one edge region of the channel region.

Here, the material of the first semiconductor layer and the material of the semiconductor layer both are polysilicon, and a doping concentration of the polysilicon may be adjusted to allow the work function of the polysilicon material of the second semiconductor layer material to be lower than the work function of the polysilicon material of the first semiconductor layer material, so as to allow a work function of the auxiliary layer material to be lower than a work function of the active layer material.

In other examples, other combinations may be selected, in which the work function of the active layer material is higher than the work function of the auxiliary layer material.

In a modified embodiment, the active layer 205 and the auxiliary layer 203 may be formed through one exposure process. For example, the active layer 205 and the auxiliary layer 203 are formed through one exposure process with a half tone mask. The specific method is similar to the step for forming the gate electrode 202 and the auxiliary layer 203 through one exposure process in the fifth embodiment, which is not repeated here.

Figure 10:
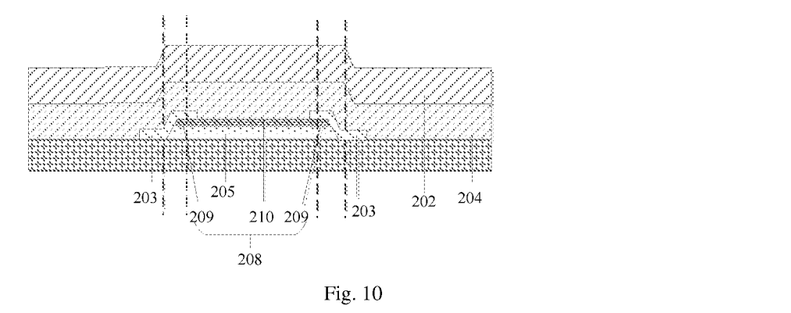

Step S83, forming a gate insulating layer, a gate electrode, a source electrode and a drain electrode.

As illustrated in FIG. 10, a gate insulating layer 204 is formed on the auxiliary layer 203 and then a conductive layer is formed on the gate insulating layer 204. A gate electrode 202, a source electrode and a drain electrode (not shown) are formed by using a third patterning process to pattern the conductive layer. In this way, the thin film transistor 200 of the fourth embodiment of the present disclosure is formed.

As illustrated in the figure, projections of the gate electrode 202, the auxiliary layer 203 and the active layer 205 on the substrate 201 are at least partially overlapped.

In this embodiment, a work function of the first semiconductor layer material is selected to be higher than a work function of the second semiconductor layer material to allow the work function of the auxiliary layer material to be lower than the work function of the active layer material. In this way, a work function difference between the gate electrode material and the auxiliary layer material is greater than a work function difference between the gate electrode material and the active layer material so as to ultimately allow a turn-on voltage of the edge region 209 of the channel region 208 to be higher than a turn-on voltage of the main region 210.

In a modified embodiment, the step for forming the auxiliary layer 203 happens before forming the gate insulating layer 204 and before or after forming the gate electrode 202. In this embodiment, a material of the auxiliary layer 203 is a conductive material, and the auxiliary layer 203 is as the auxiliary gate electrode. There are two auxiliary gate electrodes, and the two gate electrodes are disposed to respectively correspond to the two edge regions 209 of the channel region 208, and a projection of each of the two gate electrodes on the substrate 201 is at least partially overlapped with a projection of the corresponding edge region 209 on the substrate 201. Further, a work function of a material of the auxiliary layer 203 is enabled to be higher than a work function of a material of the gate electrode 202, so that a turn-on voltage of the edge region 209 is enhanced.

For example, the auxiliary layer 203 is formed between the gate electrode 202 and the gate insulating layer 204, so that the thin film transistor 200 as illustrated in FIG. 4B is formed.

For example, the auxiliary layer 203 is formed in a same layer with the gate electrode 202; that is, the auxiliary layer 203 and the gate electrode 202 are formed on a same surface of the gate insulating layer 204. In this way, the thin film transistor 200 as illustrated in FIG. 4C is formed. For example, the gate electrode 202 and the auxiliary layer 203 may be respectively formed through performing a deposition process and a patterning process to a conductive material twice, which is not repeated here. For example, a thickness of the auxiliary layer 203 is identical with a thickness of the gate electrode 202.

For example, the material of the gate electrode is molybdenum (Mo), of which the work function is 4.37 eV; the material of the auxiliary layer is platinum (Pt), of which the work function is 5.65 eV. In this way, the difference between the work function of the material of the auxiliary layer 203 and the work function of the material of the active layer is greater than a difference between the work function of the material of the gate electrode 202 and the work function of the material of the active layer.

In other embodiments, other combinations may be selected, in which the work function of the auxiliary layer material is higher than the work function of the gate electrode material. For example, the material of the gate electrode is one or any combination of the following metal materials: copper (4.65 eV), molybdenum (4.37 eV), titanium (4.33 eV), tungsten (4.55 eV), and aluminum (4.28 eV); and the material of the auxiliary layer is one or any combination of the following metal materials: platinum (5.65 eV), gold (5.1 eV) and palladium (5.12 eV).

For example, the material of the gate electrode and the material of the auxiliary layer both may be a conductive material with an adjustable work function, for example, conductive silicon or a conductive metal oxide.

For example, the material of the gate electrode and the material of the auxiliary layer are both polysilicon, and a doping concentration of the polysilicon may be adjusted to allow the work function of the auxiliary layer material to be higher than the work function of the gate electrode material. Similarly, for example, the material of the gate electrode and the material of the auxiliary layer are both indium tin oxide (ITO), and a composition of the ITO may be adjusted to allow the work function of the auxiliary layer material to be higher than the work function of the gate electrode material.

For example, in a case of manufacturing an array substrate for a liquid crystal display device, an organic light-emitting diode display device and the like, components such as a storage capacitor and a pixel electrode may be formed meanwhile forming the thin film transistor.

In the manufacturing method of a thin film transistor provided by embodiments of the present disclosure, by providing an auxiliary layer in the thin film transistor and selecting a work function of the material, a work function difference of metal-semiconductor corresponding to the edge region of the channel region of the active layer is allowed to be higher than a work function difference of metal-semiconductor corresponding to the main region of the channel region, so that the turn-on voltage of the edge region of the channel region is enhanced and a turn-on current is almost synchronously generated in the edge region as well as in the main region of the channel region. In this way, the hump effect of the thin film transistor is alleviated or eliminated and the performance of the thin film transistor is improved.

Seventh Embodiment

An embodiment of the present disclosure further provides an electronic device, and the electronic device comprises the thin film transistor 200 according to any one embodiment of the present disclosure. For example, the electronic device is a display device such as a liquid crystal display device, an organic light-emitting diode display device and an e-paper display device. For example, a pixel unit of the display device comprises the thin film transistor 200. Or, for example, a driving circuit of the display device comprises the thin film transistor 200.

The display decide may comprise an array substrate, the thin film transistor of the above mentioned pixel unit or driving circuit (i. e. GOA) is formed on the array substrate and the thin film transistor may adopt the thin film transistor of any one embodiment of the present disclosure.

Figure 11:
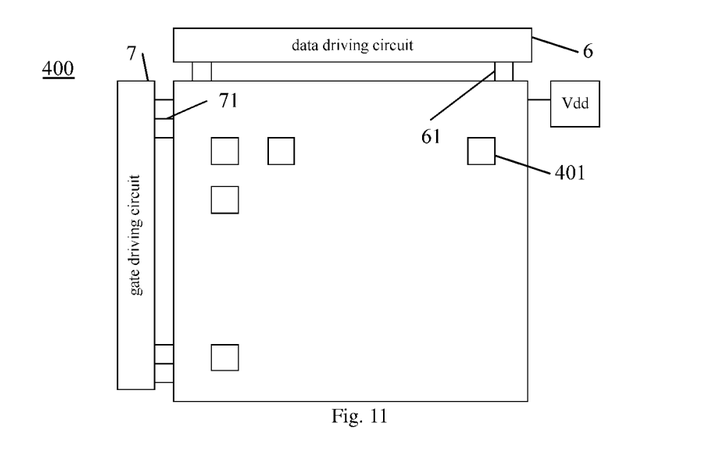
FIG. 11 is a schematic view of an electronic device provided by a seventh embodiment of the present disclosure.
Figure 12:
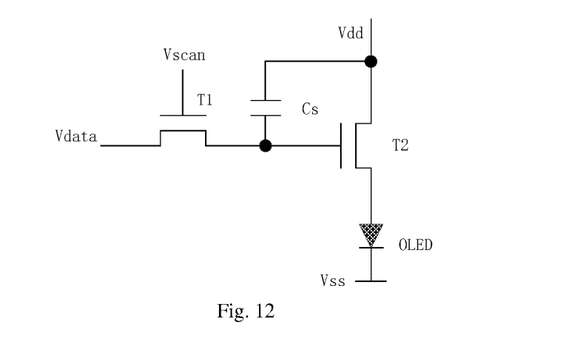
FIG. 12 is a schematic view of a 2T1C pixel circuit of the electronic device provided by the seventh embodiment.

FIG. 11 is a schematic diagram of an electronic device 400 provided by a seventh embodiment of the present disclosure and FIG. 12 is schematic view of a pixel circuit of the electronic device of FIG. 11. Referring to FIG. 11 in combination with FIG. 12, the electronic device 400 is an organic light-emitting diode display device. The organic light-emitting diode display device comprises a plurality of pixel units 401 arranged in an array, each pixel unit 401 comprises at least one organic light-emitting diode and a pixel circuit connected with the organic light-emitting diode, and the organic light-emitting diode is driven to emit light by the pixel circuit.

FIG. 12 is a schematic view of a 2T1C pixel circuit of an organic light-emitting diode electronic device. The pixel circuit comprises a switch transistor T1, a driving transistor T2 and a storage capacitor Cs. A gate electrode of the switch transistor T1 is connected with a gate line to receive a scan signal (Scan), a source electrode is connected with a data line to receive a data signal (Vdata) for example, and a drain electrode is connected with a gate electrode of the driving transistor T2. A source electrode of the driving transistor T2 is connected with a first power source terminal (Vdd, a high voltage terminal) and a drain electrode is connected with a positive end of OLED. One end of the storage capacitor Cs is connected with the drain electrode of the switch transistor T1 and the gate electrode of the driving transistor T2, and the other end is connected with the source electrode of the driving transistor T2 and the first power source terminal. A negative end of the OLED is connected with a second power source terminal (Vss, a low voltage end), for example, is grounded. A driving manner of the 2T1C pixel circuit is to control bright and dark (a greyscale) of a pixel by two TFTs and a storage capacitor Cs. When the scan signal Scan is applied by the gate line to turn on the switch transistor T1, the data voltage (Vdata) which is sent through the data line by a data driving circuit sends charges the storage capacitor Cs through the switch transistor T1, so as to store the data voltage in the storage capacitor Cs. The stored data voltage controls a conduction degree of the driving transistor T2 so as to control a current value of current which runs through the driving transistor to drive the OLED to emit light; that is, the current determines an emission greyscale of the OLED. In the 2T1C pixel circuit as illustrated in FIG. 12, the switch transistor T1 and the driving transistor T2 both may adopt the thin film transistor 200 of the embodiments of the present disclosure for example.

As illustrated in FIG. 11, the organic light-emitting diode display device may further comprise a data driving circuit 6 and a gate driving circuit 7. The data driving circuit 6 is configured to provide a data signal and the gate driving circuit 7 is configured to provide a scan signal (e. g. the signal Vscan) and may be further configured to provide various kinds of control signals. The data driving circuit 6 is electrically connected with the pixel unit 401 through the data line 61, and the gate driving circuit 7 is electrically connected with the pixel unit 401 through the gate line 71. The data driving circuit 6 and the gate driving circuit 7 both comprises a thin film transistor which may adopt the thin film transistor 200 of the embodiments of the present disclosure for example.

For example, the display device may be applied in any product or component having display functions such as a cellphone, a tablet computer, a television, a displayer, a notebook computer, a digital photo frame, a navigator and the like.

What are described above is related to the illustrative embodiments of the disclosure only and not limitative to the scope of the disclosure; the scopes of the disclosure are defined by the accompanying claims.

The application claims priority to the Chinese patent application No. 201710835326.X, filed on Sep. 15, 2017, the entire disclosure of which is incorporated herein by reference as part of the present application.

What is claimed is:

1. A thin film transistor, comprising:
a substrate, and
a gate electrode, a gate insulating layer, an active layer, a source electrode and a drain electrode, arranged on the substrate,
wherein the active layer comprises a channel region between the source electrode and the drain electrode and the channel region comprises an edge region along a channel length direction of the channel region and a main region outside the edge region;
the thin film transistor further comprises an auxiliary layer, and the auxiliary layer is configured to enhance a turn-on voltage of the edge region of the channel region; and
the auxiliary layer is between the gate electrode and the active layer, wherein the auxiliary layer comprises two auxiliary structures which are spaced apart from each other;
the source electrode and the drain electrode are opposite to each other along the channel length direction of the channel region, and
the two auxiliary structures are opposite to each other along a channel width direction of the channel region.

2. The thin film transistor according to claim 1, wherein the two auxiliary structures are disposed respectively corresponding to two edge regions of the channel region which are opposite to each other along the channel width direction of the channel region, and
projections of the two auxiliary structures on the substrate are respectively at least partially overlapped with projections of the two edge region of the channel region on the substrate.

3. The thin film transistor according to claim 1, wherein a material of the auxiliary layer is a conductive material, and
the auxiliary layer is located between the gate electrode and the gate insulating layer, and is electrically connected with the gate electrode.

4. The thin film transistor according to claim 3, wherein a difference between a work function of a material of the auxiliary layer and a work function of a material of the active layer is greater than a difference between a work function of a material of the gate electrode and the work function of the material of the active layer.

5. The thin film transistor according to claim 3, wherein a work function of a material of the auxiliary layer is higher than a work function of a material of the gate electrode.

6. The thin film transistor according to claim 3, wherein the thin film transistor is in a bottom-gate structure;
a thickness of the auxiliary layer is less than one tenth of a thickness of the gate electrode.

7. The thin film transistor according to claim 1, wherein the auxiliary layer is in a same layer with the gate electrode and is electrically connected with the gate electrode.

8. The thin film transistor according to claim 1, wherein a material of the gate electrode is copper, molybdenum, titanium, aluminum, conductive silicon or a conductive metal oxide;
a material of the auxiliary layer is platinum, gold, palladium, silicon or a conductive metal oxide.

9. The thin film transistor according to claim 1, wherein a material of the auxiliary layer is a semiconductor, and
the auxiliary layer is between the active layer and the gate insulating layer.

10. The thin film transistor according to claim 9, wherein a difference between a work function of a material of the gate electrode and a work function of the material of the auxiliary layer is greater than a difference between the work function of the material of the gate electrode and a work function of a material of the active layer.

11. The thin film transistor according to claim 9, wherein the work function of the material of the auxiliary layer is lower than a work function of a material of the active layer.

12. An electronic device, comprising the thin film transistor according to claim 1.

13. The electronic device according to claim 12, wherein the electronic device is a liquid crystal display device, an organic light-emitting diode display device or an e-paper display device.

14. A thin film transistor, comprising:
a substrate, and
a gate electrode, a gate insulating layer, an active layer, a source electrode and a drain electrode, arranged on the substrate,
wherein the active layer comprises a channel region between the source electrode and the drain electrode and the channel region comprises an edge region along a channel length direction of the channel region and a main region outside the edge region;
the thin film transistor further comprises an auxiliary layer, and the auxiliary layer is configured to enhance a turn-on voltage of the edge region of the channel region;
the auxiliary layer is in a same layer with the gate electrode and is electrically connected with the gate electrode, and
wherein the auxiliary layer comprises two auxiliary structures which are on two sides, which are opposite to each other along a channel width direction of the channel region, of the gate electrode;

the source electrode and the drain electrode are opposite to each other along the channel length direction of the channel region.

15. The thin film transistor according to claim 14, wherein the two auxiliary structures are disposed respectively corresponding to two edge regions of the channel region which are opposite to each other along the channel width direction of the channel region, and projections of the two auxiliary structures on the substrate are respectively at least partially overlapped with projections of the two edge regions of the channel region on the substrate.

16. The thin film transistor according to claim 14, wherein a difference between a work function of a material of the auxiliary layer and a work function of a material of the active layer is greater than a difference between a work function of a material of the gate electrode and the work function of the material of the active layer.

17. The thin film transistor according to claim 14, wherein a work function of a material of the auxiliary layer is higher than a work function of a material of the gate electrode.

18. The thin film transistor according to claim 14, wherein the auxiliary layer is made of a different material from the gate electrode;

a material of the gate electrode is copper, molybdenum, titanium, aluminum, conductive silicon or a conductive metal oxide; and a material of the auxiliary layer is platinum, gold, palladium, silicon or a conductive metal oxide.

\* \* \* \* \*